United States Patent [19]

Nishizawa et al.

[11] Patent Number: 4,482,910

[45] Date of Patent: Nov. 13, 1984

[54] HETEROJUNCTION EMITTER TRANSISTOR WITH SATURATION DRIFT VELOCITY GRADIENT IN BASE

[75] Inventors: Jun-ichi Nishizawa; Tadahiro Ohmi, both of Sendai, Japan

[73] Assignee: Zaidan Hojin Handotai Kenkyu Shinkokai, Sendai, Japan

[21] Appl. No.: 574,648

[22] Filed: Jan. 30, 1984

Related U.S. Application Data

[63] Continuation of Ser. No. 245,546, Mar. 19, 1981, abandoned.

[30] Foreign Application Priority Data

Mar. 21, 1980 [JP] Japan .................... 55-36599

[51] Int. Cl.³ .............. H01L 29/165; H01L 29/203; H01L 29/205; H01L 29/72
[52] U.S. Cl. ........................... 357/34; 357/4; 357/16; 357/58; 357/89; 357/90
[58] Field of Search ............. 357/16, 33, 34, 3, 4, 357/13, 89, 90, 58

[56] References Cited

U.S. PATENT DOCUMENTS

| | | | |
|---|---|---|---|
| 3,780,359 | 12/1973 | Dumke et al. | 357/16 |
| 4,062,034 | 12/1977 | Matsushita et al. | 357/16 |
| 4,119,994 | 10/1978 | Jain et al. | 357/16 |
| 4,149,174 | 4/1979 | Shannon | 357/15 |
| 4,173,763 | 11/1979 | Chang et al. | 357/16 |
| 4,266,238 | 5/1981 | Nishizawa | 357/14 |
| 4,286,275 | 8/1981 | Heiblum | 357/16 |
| 4,302,763 | 11/1981 | Ohuchi et al. | 357/16 |

OTHER PUBLICATIONS

Frey, "Ballistic Transport . . . ", 1980 *IEEE International Electron Devices Meeting, Technical Digest,* pp. 613–617, (Dec. 7, 1980).
Sze, *Physics of Semiconductor Devices,* 2nd Ed., (Wiley, N.Y., 1981), pp. 46, 58, 59.
Ross et al., "Heterojunction Transistors . . . ", Electronic Engineering, vol. 49, No. 589, Mar. 1977, pp. 35–38.
Shannon, "Hot-Electron Camel Transistor, "J. Solid State and Electron Devices, vol. 3, No. 5, Sep. 1979, pp. 142–144, (published by IEE, United Kingdom).
Peltier, IEEE Int. Solid State Circs. Conf. Digest of Tech. Papers, Feb. 1975, pp. 168–169.
N. Oh-uchi, H. Hayashi, H. Yamoto and T. Matsushita, "A New Silicon Heterojunction Transistor Using the Doped SIPOS", Tech. Dig. of 1979 IEDM., pp. 522–525, (1979–12).
T. Matsushita, N. Oh-uchi, H. Hayashi and H. Yamoto, "A Silicon Heterojunction Transistor", Appl. Phys. Lett., vol. 35, pp. 549–550, (1979).
H. Kroemer, "Theory of a Wide-Gap Emitter for Transistor", Proc. IRE., pp. 1535–1537, (1957).

*Primary Examiner*—William D. Larkins
*Attorney, Agent, or Firm*—Cushman, Darby & Cushman

[57] ABSTRACT

A thermionic emission transistor comprising: an emitter region formed with a semiconductor material having a first conductivity type and a high impurity concentration; a collector region formed with a semiconductor material having a first conductivity type and a high impurity concentration; a base region made of a semiconductor material having a second conductivity type opposite to said first conductivity type and a high impurity concentration, that portion of said emitter region located adjacent to said base region having an energy band gap broader than that of the base region, that portion of said base region located adjacent to the emitter region having an impurity concentration of about $3 \times 10^{18} cm^{-3}$ or more. Such new transistor has a large transconductance and can be operated with a very large current gain in spite of a very small size of the whole device, and is very suitable for integrated circuit. This transistor requires a small driving power and has a large capability of driving subsequent stages and load, and allows a number of fan-outs is taken and the operating speed is very high.

20 Claims, 13 Drawing Figures

HETEROJUNCTION EMITTER TRANSISTOR WITH SATURATION DRIFT VELOCITY GRADIENT IN BASE

This is a continuation of Ser. No. 245,546 filed Mar. 19, 1981, now abandoned.

BACKGROUND OF THE INVENTION (a) Field of the Invention

The present invention relates to thermionic emission transistors, and more particularly it pertains to a new transistor which is operated by controlling the carriers which are caused to emit due to emission of thermoelectrons.

(b) Description of the Prior Art

Firstly, the characteristics and problems of conventional transistors will hereinafter be described to serve as the materials for explaining the operation principle, the characteristics and the superiority of the new transistor according to the present invention. The conventional three-terminal devices which are called "transistors" can be roughly grouped into the following three typical types.

One of them is a bipolar transistor which will hereinafter be referred to as BJT. This BJT has three terminals which are called "emitter", "base" and "collector". Another typical device is a "unipolar field effect transistor" which will hereinafter be referred to as FET. The three terminals of FET are "source", "gate" and "drain". The other typical device is a "static induction transistor" which will hereinafter be referred to as SIT. This latter SIT is a transistor which was developed relatively recently by Dr. Jun-ichi NISHIZAWA and was reported in IEEE Trans. On Electron Devices, vol. ED-22, pp 185-197, 1975. The characteristic and operational mechanism of this SIT was first reported in said literature. The three terminals of SIT are "source", "gate" and "drain" same as those of FET.

In these three kinds of conventional transistors, the region for supplying carriers, i.e., the emitter region in BJT and the source region in FET and SIT, is designed to have a high impurity concentration. This is because of the intention that carriers be supplied efficiency. The impurity concentration of the emitter or source region desirably is set as high as possible so long as other conditions permit, i.e., so long as crystal defects such as dislocation and strain caused by the introduction of impurities in the semiconductor material will not have any adverse effect on the characteristics of the device.

Control mechanism of the electric current which is allowed to flow in the main operation of these conventional transistors is as follows. That is, in a BJT, the amount of current flowing from emitter to collector is controlled by controlling the potential across the emitter and the base via the base resistance, by controlling the voltage applied to the base electrode serving as the control electrode of BJT. In an FET, on the other hand, the amount of the current flowing from source to drain is controlled by controlling the channel width on the source side by varying the potential gradient within the depletion layer due to the voltage applied to the gate (control) electrode and/or by varying the channel resistance, i.e., IR drop, due to the voltage applied to the drain. In a SIT, the amount of the flow of current is controlled by controlling the channel potential close to the source region by varying the potential profile within the depletion layer due to the voltage applied to the gate (control) electrode and/or through the potential profile within the depletion layer growing in the channel due to the voltage applied to the drain.

The primary feature of the transistor according to the present invention lies in that the current density can be made very large. When the current densities of these three types of conventional transistors are compared, the BJT is found to exhibit the largest current density per unit area of the device. Therefore, description will hereunder be made of the limit in terms of amount of current in BJT.

Figure 1:
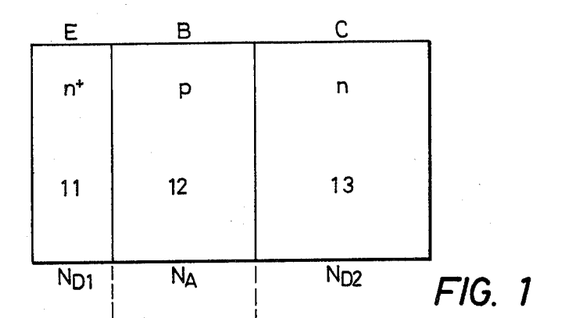
FIG. 1 is a schematic sectional view of conventional bipolar transistor.
Figure 2:
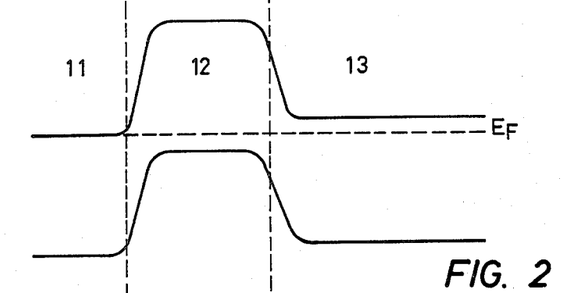
FIG. 2 is a schematic energy band diagram of same.
Figure 3:
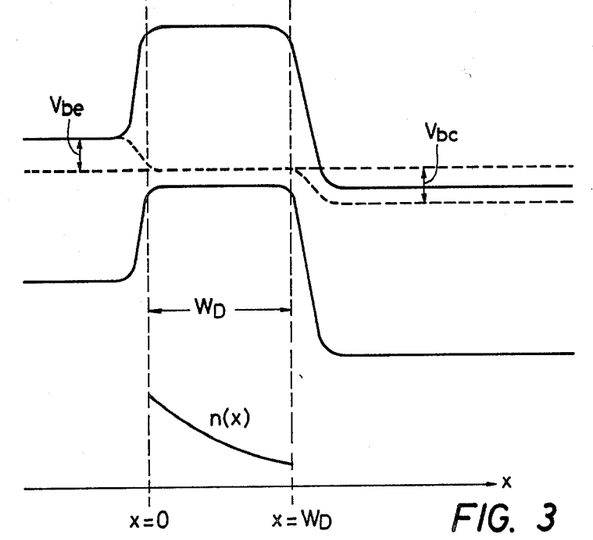
FIG. 3 is a schematic illustration of band diagram, and minority carrier distribution in the base region of same.

FIG. 1 shows schematically the construction of an npn type BJT. In the Figure, reference numeral 11 represents an n+ type emitter region, 12 a p type base region, and 13 an n type collector region. For the simplicity of explanation, the discussion will be made of a single dimensional structure. FIG. 2 shows the energy band diagram of the npn type BJT at the absence of applied voltage. In FIG. 2 the level indicated by a broken line represents the Fermi level $E_F$. Since the emitter region has a high impurity concentration, the Fermi level is degenerated and is positioned to be in contact or in agreement with the bottom of the conduction band. FIG. 3 shows the energy band diagram of this BJT upon the application of a voltage, i.e., in an operative state. More specifically, FIG. 3 shows the energy band diagram under operating conditions wherein a forward voltage $V_{be}$ is applied across the emitter and the base and a reverse voltage $V_{bc}$ is applied across the base and the collector respectively. For convenience, the distribution n(x) of minority carriers injected into the base is schematically illustrated at the bottom of FIG. 3. Since a forward voltage $V_{be}$ is applied across the emitter and the base, and since a reverse voltage $V_{bc}$ is applied across the base and the collector, the minority carrier distribution n(x) within the base region decreases progressively from the emitter-base contact position (x=0) toward the base-collector contact (x=$W_b$). On the other hand, when the density J of the injected electrons is small as compared with the acceptor density $N_A$ of the base region, and if the impurity concentration $N_A$ within the base region is assumed to be uniformly distributed, the current flows only in diffusion mechanism, and the current density J is given by:

$$J = -qD_{nb}\frac{dn(x)}{dx} \tag{1}$$

wherein:
q represents the unit electronic charge;
$D_{nb}$ represents the diffusion coefficient of electrons in the base region; and
x represents the coordinate for position.

When the reverse voltage across the base and the collector is small, the electron density $n(W_b)$ at the junction of the base and collector regions is not so small. As $V_{bc}$ increases, $n(W_b)$ will become progressively smaller. More specifically, the density distribution of the electrons injected in the base region will become steeper with an increase in $V_{bc}$. That is, as $V_{bc}$ grows larger, the minority carrier gradient dn(x)/dx becomes greater, and the current density J given by Formula (1) will increase progressively. However, if $V_{bc}$ exceeds a certain level, $n(W_b)$ will assume a negligibly small value. Unless the recombination of the minority carriers within the base region is extremely prominent, the Formula (1), in the negligible condition of $n(W_b)$, can be approximately rewritten to:

$$J = qD_{nb}\frac{n(0)}{W_b} \quad (2)$$

wherein: $W_b$ represents the base width. Ordinarily, $n(0)$ is given by:

$$n(0) = n_{pb}e^{\frac{qV_{be}}{kT}} \quad (3)$$

wherein: $n_{pb}$ herein mentioned represents the minority carrier concentration in the p type base region under thermal equilibrium and under no applied voltage, and is $ni^2/N_A$ (ni represents the intrinsic carrier concentration).

That is, as will be understood from Formulas (2) and (3), if the emitter-base forward voltage $V_{be}$ is determined, the amount $n(0)$ of the minority carriers injected at $x=0$ is determined, since both the structure and the impurity concentrations of BJT have been set already. Accordingly, even when the value of $V_{bc}$ is increased beyond a certain level, it should be noted that the current density J which is given by Formula (2) will become constant. Needless to say, if a depletion layer expands due to an increase in $V_{bc}$ and if, as a result, $W_b$ is reduced, current density J will increase accordingly. As stated above, the current density J is subjected to limitation at a certain value thereof. In order to increase the value of current density J, it is desirable to reduce the value of base width $W_b$. If the width $W_b$ of the base region is reduced progressively, the base resistance $r_{bb}$ of the base region located beneath the emitter electrode up to the base terminal will become large, and the signal voltage applied across the base and the emitter ceases to be uniform throughout the entire region of the emitter-base junction. Thus, the base width $W_b$ cannot be made very small. In order to suppress the increase of the base resistance $r_{bb}$ while reducing the base width $W_b$, the impurity concentration $N_A$ of the base region has to be increased. However, if $N_A$ is increased too much, this will bring about a drop in the injection efficiency $\gamma$. The injection efficiency $\gamma$ represents the ratio of the current caused by the carriers injected from the emitter region to the forward emitter-base current, and it is given by:

$$\gamma = \frac{J_n}{J_n + J_p} = \frac{1}{1 + \frac{D_{pe}}{D_{nb}} \cdot \frac{P_{ne}}{n_{pb}} \cdot \frac{W_b}{L_{pe}}} \quad (4)$$

wherein:
$D_{pe}$ represents the diffusion coefficient of the holes injected from the base region into the emitter region;

$P_{ne}$ represents the hole density in the emitter region under thermal equilibrium and no applied voltage, and here $P_{ne}=ni^2/N_{D1}$ (wherein: $N_{D1}$ represents the donor concentration of the n+ type emitter region); and $L_{pe}$ represents the diffusion distance of the holes in the emitter region.

The condition in which Formula (4) is applicable in the instance in which the diffusion distance $L_{pe}$ is smaller than the thickness $W_e$ of the emitter region. If $W_e < L_{pe}$, then $L_{pe}$ in Formula (4) is replaced by $W_e$. As stated above, the minority carrier concentration $n_{pb}$ is expressed by: $n_{pb}=ni^2/N_A$. Accordingly, Formula (4) may be rewritten as:

$$\gamma = \frac{1}{1 + \frac{D_{pe}}{D_{nb}} \cdot \frac{N_A}{N_{D1}} \cdot \frac{W_b}{L_{pe}}} \quad (5)$$

As will be understood from Formula (5), when $N_A$ gains a level that is no longer negligible relative to the emitter donor concentration $N_{D1}$, $\gamma$ becomes small, and the efficiency of operation of the transistor is denigrated. Usually, in a silicon BJT, if $N_{D1}$ is selected to be in the order of $10^{20}-10^{21}$ cm$^{-3}$, $N_A$ is selected at a value below the order of $10^{18}$ cm$^{-3}$. It should be noted that it is because the width of the depletion layer produced between the base and emitter regions is sufficiently long as compared with the mean free path of the carriers that the number of the injected minority carriers at the emitter terminal of the base region at $x=0$ is given by Formula (3) or that the carrier density is expressed by Formula (1) or (2). The base-emitter depletion layer width $W_{be}$, assuming that this junction is abrupt junction and $N_{D1} >> N_A$, is given by:

$$W_{be} = \left( \frac{2\epsilon}{qN_A}(V_{bi} - V_{be}) \right)^{\frac{1}{2}} \quad (6)$$

wherein:
$\epsilon$ represents the dielectric constant, i.e. permitivity and $V_{bi}$ represents the built-in voltage or diffusion potential.

As the forward voltage $V_{be}$ is increased, the depletion layer width decreases. For example, the width of the base-emitter depletion layer in a silicon device. With $N_A=1 \times 10^{18}$ cm$^{-3}$, if $V_{be}=0$ V, then $W_{be} \approx 380$ Å, and if $V_{be}=0.8$ V, then, $W_{be} \approx 200$ Å. Usually, the mean free path l of electrons within silicon at room temperature is considered to be about 50 Å to about 100 Å. In the case of GaAs, the path l is said to be a little longer than that. Accordingly, in the ordinary operating state of the device, $W_{be}$ is always greater than l. As such, from Formulas (2) and (3), the current density J of a known BJT having a constant impurity concentration of the base region is limited by:

$$J \approx qD_{nb}\frac{n_{pb}}{W_b}e^{\frac{qV_{be}}{kT}}. \quad (7)$$

In the so-called drift transistor an impurity concentration distribution is provided in the base region in the direction from the emitter to collector, not only due to the injected minority carriers (which flow in the diffusion fashion through the base region as described above), but also by virtue of the effect of the electric field E(x) formed within the base region. The current density in such transistors is increased from Formula (7), and becomes $$J \approx -qD_{nb}\frac{dn(x)}{dx} + q\mu_n n(x)E(x). \quad (8)$$

Here, if the impurity concentration distribution varies substantially exponentially, the electric field E(x) in the base region will substantially become:

$$E(x) \approx \frac{kT}{q} \quad \frac{1}{W_b} \quad ln \frac{N_{Aeb}}{N_{Abc}} \qquad (9)$$

wherein:

μn represents the electron mobility in the base region;
k represents the Boltzmann constant;
T represents the temperature °K.;
$N_{Aeb}$ represents the impurity concentration of the base region on the emitter side; and
$N_{Abc}$ represents the impurity concentration of the base region on the collector side.

In such ordinary transistor having a uniform distribution of impurity concentration in the base region, the transport of carriers is dominated by diffusion. In a conventional BJT, even if arranged to be of a drift transistor structure (so that, for example, the width $W_b$ of the base region is made narrow such as 0.1 μm and a drift field effect is applied) current density has been limited to about $10^4$ A/cm$^2$ at maximum.

In each transistor of conventional BJT, FET and SIT, it is necessary to enhance the current density of the transistor in order to improve the high frequency characteristic and to provide a high-speed operation. That is, for high-speed operation and high-frequency characteristics it is necessary to arrange the device to cause the flow of as large a current as possible through as small an area as possible. However, even in a BJT which, among all conventional transistors, allows one to obtain the largest current density, there still is a limit for the current density which can be obtained. In order to obtain a very high current density, it is desirable that a potential barrier for controlling the injection of carriers be provided at a site located very close to the emitter or source region having a high impurity concentration serving as the region for supplying carriers, and that this potential barrier be efficiently controlled by a control electrode. However, if it is intended to efficiently control the height of the potential barrier by electrostatic control through a depletion layer in much the same way as in an SIT, the distance between the carrier-supplying region and the position of maximum height of the potential barrier must be substantially equal to the interval between the control electrodes. Therefore, if it is intended to reduce the distance between the carrier-supplying region and the position of maximum height of potential barrier, the interval between the control electrodes unavoidably becomes too narrow, and this is not desirable from the viewpoint of manufacture either. If it is intended to control the potential barrier through a resistance as in the case of BJT, this must be accomplished by an increase in the impurity concentration of the base region as discussed above. As a result, there is provided a transistor which has a lowered carrier injection effect and has a small current gain.

SUMMARY OF THE INVENTION

It is, therefore, an object of the present invention to provide a new type of transistor which eliminates the abovesaid inconveniences and drawbacks of conventional transistors and which permits one to obtain a very large current density.

A further object of the present invention is to provide a thermionic emission transistor of the type as described above, which comprises:

an emitter region formed with a semiconductor material having a first conductivity type and a high impurity concentration;
a collector region formed with a semiconductor material having a first conductivity type and a high impurity concentration; and
a base region made of a semiconductor material having a second conductivity type opposite to said first conductivity type and a high impurity concentration, that portion of said emitter region located adjacent to said base region having an energy band gap broader than that of the base region, that portion of said base region located adjacent to the emitter region having an impurity concentration of about $3 \times 10^{18}$ cm$^{-3}$ or more.

DETAILED DESCRIPTION OF THE PREFERRED EMBODIMENTS

The transistor according to the present invention is arranged so that those carriers which are emitted, due to thermal motion of electrons, from the emitter region having a high impurity concentration are caused to travel directly into the base region by controlling, from a relatively remote location through a resistor, the height of the potential barrier which exists quite close to the emitter region. This transistor is herein named a thermionic emission transistor.

Figure 4:
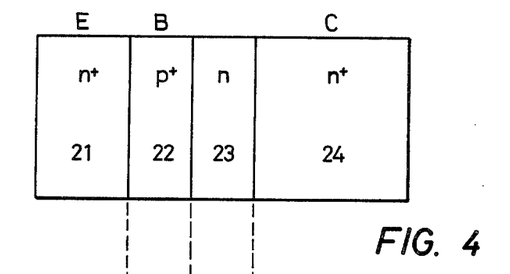
FIG. 4 is a schematic sectional view of the transistor showing the principle of the present invention.
Figure 5:
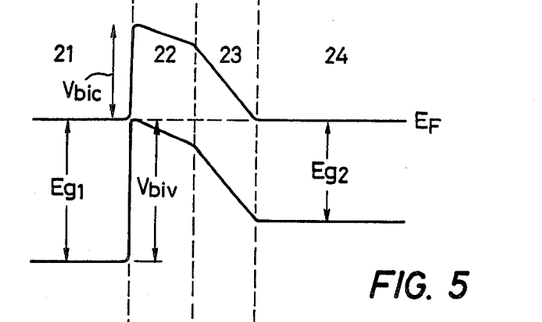
FIG. 5 is a schematic energy band diagram wherein $V_{be}=0$ and $V_{bc}=0$.
Figure 6:
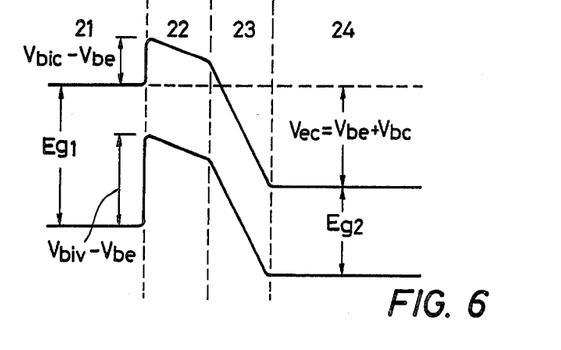
FIG. 6 is a schematic energy band diagram in one operation mode wherein $V_{be}\neq 0$ and $V_{bc}\neq 0$.

FIGS. 4, 5 and 6 are diagrams for explaining the principle of the transistor of the present invention. FIG. 4 is a schematic sectional view. FIG. 5 is an energy band diagram under equilibrium state wherein no voltage is applied. FIG. 6 is an energy band diagram at the operating state of the device. In the transistor of the present invention, reference numeral 21 represents an n$^+$ type emitter region, 22 a p$^+$ type base region, 23 an n type relatively high resistivity region, and 24 an n$^+$ type collector region. A feature of the present invention is that the transistor is so designed that the energy band gap $E_{g1}$ of the n$^+$ type emitter region 21 is larger than the energy band gaps $E_{g2}$ of the remaining regions 22, 23 and 24. That is, the emitter-base junction is provided in the form of a so-called hetero-junction wherein the junction is formed with different semiconductor materials. Another feature is found in the arrangement of impurity concentrations of the emitter and base regions. That is, the emitter region has a relatively high impurity concentration as in the case of known transistors. Along therewith, however, the base region is also formed with a high impurity concentration, and especially in that portion of the base region located close to its junction with the emitter region. Accordingly, the width of the transition region in the conduction band or valence band between the emitter and base regions wherein there exists a potential gradient, is very narrow and when a predetermined forward bias is applied across the base and emitter regions, said width is almost equal to or shorter than the mean free path of electrons.

In the embodiment shown in FIG. 4, a gradient is provided in the impurity concentration of the p+ type base region 22, and a drift electric field is produced in this base region. In FIG. 5, symbol $V_{bic}$ represents the potential difference in the emitter-base conduction band. Symbol $V_{biv}$ represents the potential difference in the valence band.

As a matter of course, $V_{biv}$ is greater than $V_{bic}$, and $q(V_{biv}-V_{bic})$ is almost equal to the difference in the energy band gaps ($E_{g1}-E_{g2}$). The n+ type and p+ type regions have high impurity concentrations, so that they are almost degenerated, and Fermi level $E_F$ is approximately in agreement with the bottom of the conduction band or with the top of the valence band. The depletion layer due to the presence of built-in voltage between the emitter and base regions naturally appears so as to straddle both of the emitter and base regions. For the sake of simplicity, however, let us here assume that the impurity concentration of the emitter region is sufficiently high and that a depletion layer grows only on the base region side. Then, the width $W_{be}$ of the depletion layer is given by:

$$W_{be} = \left\{ \frac{2\epsilon}{qN_{Ae}} (V_{bic} - V_{be}) \right\}^{\frac{1}{2}} \quad (10)$$

wherein: $N_{Ae}$ represents the impurity concentration of that portion of the base region located close to the emitter region side.

Let us consider the instance wherein the p+ type region 22, the n type region 23 and the n+ type region 24 are formed with silicon. Since the energy band gap of silicon is about 1.1 eV, $V_{bic}$ is about 1.1 V. In Table 1 is shown the dependency of $W_{be}$ obtained from Formula (10) upon $N_{Ae}$ and $V_{be}$.

TABLE 1

| Dependency of $W_{be}$ on $N_{Ae}$ and $V_{be}$ | | | | |
|---|---|---|---|---|
| | $V_{be}$ | | | |
| $N_{Ae}$ | 0.7 V | 0.8 V | 0.9 V | 0 V |
| $3 \times 10^{18}$ cm$^{-3}$ | 132Å | 115Å | 94Å | 219Å |
| $1 \times 10^{19}$ cm$^{-3}$ | 72Å | 63Å | 51Å | 120Å |
| $3 \times 10^{19}$ cm$^{-3}$ | 42Å | 36Å | 30Å | 69Å |
| $1 \times 10^{20}$ cm$^{-3}$ | 23Å | 19.8Å | 16.2Å | 38Å |
| $3 \times 10^{20}$ cm$^{-3}$ | 13.2Å | 11.5Å | 9.4Å | 21.9Å |

As will be apparent from Table 1, by setting $N_{Ae}$ more than about $3 \times 10^{18}$ cm$^{-3}$, the value of $W_{be}$ is almost equal to or lower than the mean free path of electrons under a voltage of 0-1 V applied across the base and emitter regions during ordinary operation of a silicon transistor. FIG. 5 shows the instance wherein a depletion layer readily grows in the high-resistivity region 23 only by the built-in potential with no applied voltage, and there is formed a potential gradient therein. FIG. 6 shows the energy band diagram in the operating state of the transistor, i.e., in case a forward voltage $V_{be}$ is applied across the emitter and base regions and a reverse bias $V_{bc}$ is applied across the base and collector regions. In the transistor of the present invention, it should be understood that because a forward voltage is applied across the emitter and base regions, the height of the potential barrier when electrons are injected from the emitter region into the base region will be: $V_{bic}-V_{be}$. However, the potential barrier height when holes are injected from the base region into the emitter region will be: $V_{biv}-V_{be}$. That is, $V_{biv}-V_{be}$ is noted to be higher than $V_{bic}-V_{be}$ by an amount of potential which is proportional to about $E_{g1}-E_{g2}$. Accordingly, the injection efficiency $\gamma$ will be substantially expressed by:

$$\gamma = \frac{1}{1 + \frac{D_{pe}}{D_{nb}} \cdot \frac{N_{Ae}}{N_{D1}} \cdot \frac{W_b}{L_{pe}} \cdot e^{\frac{(E_{g1}-E_{g2})}{kT}}} \quad (11)$$

Accordingly, by setting the energy band gap of the emitter region larger than that of the base region as in the present invention, it should be understood that, even if $N_{Ae}$ becomes almost equal to $N_{D1}$ or even if $N_{Ae}$ is greater than $N_{D1}$, i.e. even if the ratio $D_{pe}N_{Ae}W_b/D_{nb}N_{D1}L_{pe}$ exceeds "1", it is possible to set the injection efficiency $\gamma$ close to "1". The value of $$e^{-\frac{E_{g1}-E_{g2}}{kT}}$$

relative to ($E_{g1}-E_{g2}$) in operation at room temperature will be shown in Table 2.

TABLE 2

| $E_{g1} - E_{g2}$ | $e^{-\frac{E_{g1}-E_{g2}}{kT}}$ |
|---|---|
| 0.1eV | $2.14 \times 10^{-2}$ |
| 0.2eV | $4.56 \times 10^{-4}$ |
| 0.3eV | $9.75 \times 10^{-6}$ |
| 0.4eV | $2.08 \times 10^{-7}$ |

Though a matter of course, it is desirable that $\gamma$ is closer to "1" as much as possible. The current amplification factor $\alpha$ of base-grounded device is given by:

$$\alpha = \gamma \beta^*$$

wherein: $\beta^*$ represents the transport factor.

Where the impurity concentration distribution of the base region is uniform, the transport factor $\beta^*$ is approximately given by:

$$\beta^* = \text{sech} \frac{W_b}{L_{nb}}. \quad (13)$$

The current gain $\beta$, i.e., the ratio between the collector current and the base current will be:

$$\beta = \frac{\alpha}{1-\alpha} = \frac{\gamma \beta^*}{1-\gamma\beta^*}. \quad (14)$$

As a transistor, the greater $\beta$, $\beta$ the more desirable. For example, where $\beta^*=1$, if $\gamma=0.9$, then $\beta=10$. If $\gamma=0.99$, then $\beta=100$. If $\gamma=0.999$, then $\beta=1000$. $\beta^*$ is usually smaller than "1", so that $\beta$ will have a further reduced value. It should be noted, however, that $\beta$ should be at least "10". Desirably, the value of $\beta$ is 100 or greater, and more desirably, 1000 or more. The greater the value of $\beta$ is, the easier the driving of the transistor becomes, and the driving power can be reduced. When $\beta$ has a very large value, only the power for charging and discharging the emitter-base capacitance is required. When the right-hand second term of denominator of Formula (11), i.e.

$$\frac{D_{pe}}{D_{nb}} \cdot \frac{N_{Ae}}{N_{D1}} \cdot \frac{W_b}{L_{pe}} \cdot e^{-\frac{(E_{g1}-E_{g2})}{kT}},$$

is smaller than such values as 0.1, 0.01, and 0.001, $\gamma$ will become about 0.9, 0.99, 0.999 or more.

If $$E_{g1} - E_{g2} > kT \ln \frac{D_{pe}}{D_{nb}} \cdot \frac{N_{Ae}}{N_{D1}} \cdot \frac{W_b}{L_{pe}} \cdot \eta, \quad (15)$$

then $\gamma$ will become:

$$\gamma > \frac{1}{1+\eta}. \quad (16)$$

By using, as the material of the emitter region, a semiconductor having a broader energy band gap than that of the base region, and, more particularly that portion of the base region which contacts the emitter region, as in the present invention, it should be understood that, even when the base region is also a region of a high impurity concentration like the highly-doped emitter region (the carrier-supplying region), the injection efficiency $\gamma$ will not become small, and can be made close to "1". Also, by elevating the impurity concentration of the base region, the width of the depletion layer growing across the emitter and base regions can be made almost equal to or less than the mean free path of carriers.

The fact that the width of the depletion layer can be made smaller than the mean free path of carriers brings about a very important and effective result. That is, by reducing the width of the depletion layer to less than the mean free path, all of those carriers which travel from the emitter region into the depletion layer region due to thermal motion can travel thereinto without scattering, owing to the fact that the width of the depletion layer is smaller than the means free path of the carriers.

As has been stated above, it is advantageous for the efficient accomplishment of emission of thermal electrons to elevate the impurity concentration of the emitter and base regions due to the resulting reduction of width of the depletion layer growing across the emitter and base regions. This, however, is entailed by the disadvantage represented by an increased emitter-base junction capacitance. Thus, the width of depletion layer need only be sufficiently small as will permit the emission of thermal electrons. In order to reduce the junction capacitance, the width of the depletion layer should not be made unnecessarily small.

Figures 7, 8:
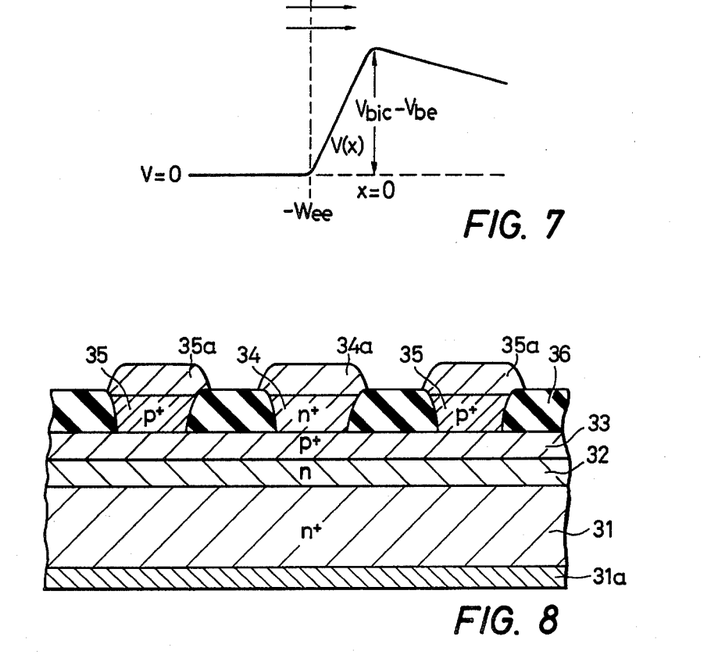
FIG. 7 is a schematic of the potential distribution of the conduction band in the vicinity of the emitter-base junction of same.
FIGS. 8 to 11 are schematic diagrams showing sectional views of some embodiments of the transistor of the present invention.

FIG. 7 shows, on an enlarged scale, the potential distribution in the vicinity of the emitter-base junction, among the energy band diagram shown in FIG. 6. The velocity of those electrons which travel from the emitter-base junction position $x=-W_{ee}$ toward direction x at thermal velocity $v_T$ is reduced by the electric field which exists within the depletion layer as the position goes progressively toward $x=0$. The electron velocity $v(x)$ at an arbitrary point between $x=-W_{ee}$ and $x=0$ within the depletion layer is given by:

$$v(x) = \left\{ v_T^2 - \frac{2qV(x)}{m_e^*} \right\}^{\frac{1}{2}} \quad (17)$$

wherein: $m_e^*$ represents the effective mass of electrons.

As stated previously, those carriers which travel into the depleted zone due to thermal motion travel without scattering within the depleted zone, so that the velocity of electrons is reduced only for the amount of the elevation of the potential. The value J of current injected into the base region due to thermoelectronic emission after passing over the potential barrier height $(V_{bic}-V_{be})$ will be given, when the rectangular coordinate components of thermal motion of electrons are designated by $v_x$, $v_y$ and $v_z$, as follows:

$$J = qN_c \left(\frac{m_e^*}{2\pi kT}\right)^{\frac{1}{2}} \int_{-\infty}^{\infty}\int_{-\infty}^{\infty}\int_{v_{ox}}^{\infty} \frac{v_x dv_x dv_y dv_z}{1+e^{\left(\frac{m_e^*(v_x^2+v_y^2+v_z^2)}{2kT}\right)}} = \frac{4\pi q m_e^* k^2 T^2}{h^3} \sum_{n=1}^{\infty} \frac{(-1)^{n+1}}{n^2} \cdot \exp\left(-\frac{nq(V_{bic}-V_{be})}{kT}\right) \quad (18)$$

wherein: $v_{ox}$ represents the minimum velocity for passing over the potential barrier, and is given by:

$$\tfrac{1}{2} m_e^* v_{ox}^2 = q(V_{bic} - V_{be}) \quad (19)$$

$$N_c = 2\left(\frac{2\pi m_e^* kT}{h^2}\right)^{\frac{1}{2}} \quad (20)$$

wherein: h represnets Planck's constant.

If $q(V_{bic}-V_{be}) >> kT$, Formula (18) will be approximated as:

$$J = \frac{4\pi q m_e^* k^2 T^2}{h^3} \exp\left(-\frac{q(V_{bic}-V_{be})}{kT}\right). \quad (21)$$

Since the carriers emitted from the emitter region due to thermal motion constitute an electric current as they travel through the depletion layer without scattering and directly into the base region, the current density which is given by Formula (21) will assume a very large value. Thus, the current density of the transistor of the present invention can be several orders of magnitude larger than the current density of ordinary transistor given by Formula (7). That is, the current density caused by the carrier injection of the transistor of the present invention is extremely large, and the transistor has the capability to cause a relatively large current to flow.

Those carriers thus injected by the phenomenon of thermal electronic emission into the base region travel within the base region. However, the width of base region is usually greater than the mean free path of carriers, and therefore they do not travel within the base region at a thermal velocity given by Formula (17), but rather are subjected to scattering a plurality of times. Thus, these carriers are destined to travel therein in the form of diffusion travel or in diffusion-drift fashion. The intensity of the electric field within the base region when an impurity concentration gradient is formd within the base region is approximately given by Formula (9). As noted above, a larger current density can be obtained as compared with the instance wherein the impurity concentration is uniform throughout the entire base region. Therefore, the p+ type base region 22 desirably is provided with an impurity concentration gradient. If the carriers can travel at highest velocity within the base region, a large amount of current can be obtained, and this is suitable for high-frequency operation. In order to increase this travel velocity, the base region desirably has a small thickness. However, consideration will be made briefly as to setting the thickness and the impurity concentration gradient for increasing the travel velocity of carriers in the base region. Let us consider the operation at room temperature. The intensity E of the electric field within the base region is sought for the thickness of the base region and for the impurity concentration $N_{Aeb}$ at the end portion of the base region located close to the emitter region and for the impurity concentration $N_{Abc}$ at the end portion of the base region located close to the collector region, as shown in Table 3.

TABLE 3

| $\frac{N_{Aeb}}{N_{Abc}}$ | $W_b$ | | |
|---|---|---|---|
| | 500Å | 1000Å | 2000Å |
| 3 | $5.71 \times 10^3$ V/cm | $2.86 \times 10^3$ V/cm | $1.43 \times 10^3$ V/cm |
| 10 | $1.2 \times 10^4$ V/cm | $6.0 \times 10^3$ V/cm | $3.0 \times 10^3$ V/cm |
| 30 | $1.77 \times 10^4$ V/cm | $8.84 \times 10^3$ V/cm | $4.4 \times 10^3$ V/cm |
| 50 | $2.04 \times 10^4$ V/cm | $1.02 \times 10^4$ V/cm | $5.1 \times 10^3$ V/cm |
| 100 | $2.4 \times 10^4$ V/cm | $1.20 \times 10^4$ V/cm | $6.0 \times 10^3$ V/cm |
| 300 | $2.96 \times 10^4$ V/cm | $1.48 \times 10^4$ V/cm | $7.4 \times 10^3$ V/cm |
| 500 | $3.14 \times 10^4$ V/cm | $1.62 \times 10^4$ V/cm | $8.1 \times 10^3$ V/cm |
| 1000 | $3.6 \times 10^4$ V/cm | $1.80 \times 10^4$ V/cm | $9.0 \times 10^3$ V/cm |

The intensity of electric field is increased by decreasing the base width even if the value of $N_{Aeb}/N_{Abc}$ is kept constant.

If, for example, the base region is formed with silicon, it has been found that, when the intensity of the electric field therein becomes $1-1.5 \times 10^4$ V/cm or greater, the velocity of the electrons will saturate. Therefore, an electric field above that order of intensity developed in the base region will suffice. If, on the other hand, the base region is formed with GaAs, the travel velocity of electrons therein will reach the saturated velocity if the impurity concentration gradient is formed in the base region so as to insure that the intensity of electric field therein is $1.5 \times 10^3$ V/cm or greater.

When the base width becomes thin, non-scattering electron transport becomes prominent.

Consideration will next be made of the impurity concentration and the thickness of the n type high-resistivity region 23 and their relationship with the p+ type low resistivity region 22. In the transistor of the present invention, an amount of carriers having a very high current density is injected from the emitter region into the base region due to emission of thermal electrons from the emitter region. Accordingly, if there is nothing present in the region located between the base region and the collector region to limit the current flow, a very large current density can be obtained. The impurity concentration and the thickness of the high-resistivity region 23 are associated with a cause of limitation.

The relationship between the potential difference $V_{sp}$ across the depleted region, the impurity concentration N within the depleted region and the width l' of the depletion region is given by:

$$V_{sp} = \frac{qN}{2E} l'^2. \tag{22}$$

The values of $V_{sp}$ relative to N and l' are shown in Table 4.

TABLE 4

| | l' | | | |
|---|---|---|---|---|
| N | 0.1 μm | 0.2 μm | 0.3 μm | 0.5 μm |
| $1 \times 10^{16}$ cm$^{-3}$ | 0.076 V | 0.305 V | 0.686 V | 1.9 V |
| $3 \times 10^{16}$ cm$^{-3}$ | 0.23 V | 0.91 V | 2.06 V | 5.71 V |
| $1 \times 10^{17}$ cm$^{-3}$ | 0.76 V | 3.05 V | 6.86 V | 19.0 V |
| $3 \times 10^{17}$ cm$^{-3}$ | 2.3 V | 9.1 V | 20.6 V | 57.1 V |

It will be appreciated that, by increasing the impurity concentration N and the width l' of the depleted region, the value of $V_{sp}$ will increase. The impurity concentration and the thickness of the high-resistivity region 23 according to the present invention must to be determined by taking the above-stated factors into account. In addition, the velocity with which the carriers having flown into the entirely depleted high-resistivity region 23 travel within this region 23 requires to be very high as stated above.

As a transistor, it is desirable that as large a current as possible can be caused to flow with as small an operating voltage as possible. To this end, it is desirable that, when the high-resistivity region 23 has become depleted and has become a space charge region, the potential difference across this space charge region is small. By assuming this potential difference as the abovesaid $V_{sp}$, this $V_{sp}$ desirably is about 2 V or less for silicon, and about 2.5 V or less for GaAs. By increasing the thickness of this space charge region, the potential difference $V_{sp}$ will suddenly increase, and a current having a large carrier density can no longer be obtained with a small operating voltage.

Let us now assume that a voltage which is about $V_{bic}$ is being applied across the high-resistivity region 23, as will be appreciated from FIG. 5. In the case of silicon, $V_{bic}$ is considered to be about 1.1 V, and in GaAs it is considered to be about 1.4 to about 1.5 V. If, therefore, this high-resistivity region is arranged so that its width is about 0.1–0.5 μm, the intensity of the electric field which develops in this depleted high-resistivity region will surpass at least $2 \times 10^4$ V/cm. More particularly, carriers will travel at the (maximum) saturated velocity $v_s$. If the assumption is made here that the density of carriers flowing into the depleted high-resistivity region is designated as $n_f$ and that the carriers travel therein at the saturated velocity $v_s$, the current density J will be given substantially by:

$$J = q n_f v_s \tag{23}$$

Usually, the saturated velocity $v_s$ is silicon is of a value of the order of $1 \times 10^7$ cm/sec. Accordingly, for $n_f = 1 \times 10^{16}$ cm$^{-3}$, $3 \times 10^{16}$ cm$^{-3}$, $1 \times 10^{17}$ cm$^{-3}$ and $3 \times 10^{17}$ cm$^{-3}$, J will be obtained as $J = 1.6 \times 10^4$ A/cm$^2$, $4.8 \times 10^4$ A/cm$^2$, $1.6 \times 10^5$ A/cm$^2$ and $4.8 \times 10^5$ A/cm$^2$, respectively.

In order that the thermionic emission transistor (abbreviated as TET) of the present invention be sufficiently effective in operation, it is desirable that the current density be about $1 \times 10^5$ A/cm$^2$ or greater. Needless to say, a current density lower than that is not without significance. If it is intended to raise J to $1 \times 10^5$ A/cm$^2$ or higher, the amount of carriers which are injected due to thermionic emission from the emitter region (which ordinarily is $6.25 \times 10^{16}$ cm$^{-3}$ or more) must be by far the greater than this latter level. The high-resistivity region 23 desirably is depleted by the built-in potential alone. Assuming from Formula (22) that the potential difference across the high-resistivity region which becomes depleted is about $V_{bic}$, it is possible to design the impurity concentration and the thickness of this region. However, Formula (22) is established only when the electric charge in the space charge region is only the charge due to ionized impurity. Thus, if the amount of the carriers injected into this region becomes greater than the impurity concentration N, a space charge voltage attributable to such excess amount of injected carriers will develop. This space charge voltage generated by the injected carriers will be given by $q(n-N)l'^2/2\epsilon$ if the amount of the injected carriers is designated as n. Accordingly, in order to reduce this value, the value of the impurity concentration N desirably is large, within the extent that the depletion layer which is formed in said high-resistivity region is obtained at a low voltage. This means that there is the necessity to design so as to increase the impurity concentration N while reducing the thickness of the high-resistivity region 23. However, if N is increased too much, there would occur a reduction of the breakdown voltage across the base and collector regions. For example, let us here consider the breakdown voltage based on the assumption that the base-collector junction is one-sided abrupt junction. If the design is made so that the base-collector breakdown voltage is 10 V, the impurity concentration N of the high-resistivity region is $1.3 \times 10^{17}$ cm$^{-3}$ in case of silicon, and $2.2 \times 10^{17}$ cm$^{-3}$ in case of GaAs. Also, if the breakdown voltage is 5 V, N will become $5 \times 10^{17}$ cm$^{-3}$ in silicon, and $8 \times 10^{17}$ cm$^{-3}$ in GaAs. Besides, with such level of impurity concentration as mentioned above, a prominent increment of reverse current due to tunnel phenomenon will be noted. Accordingly, it becomes impossible to apply a very high reverse voltage across the base and collector regions, and the applicable voltage would be about several V at most. However, even where the impurity concentration of the n type high-resistivity region is increased and such level of breakdown voltage is attained, it can be readily used to form an integrated circuit.

As stated above, a transistor having the new structure, i.e., the herein-named thermionic emission transistor (TET), can be designed to insure that the amount of carrier injection from the emitter region into the base region is very large, and that the travel of carriers within the base region is very rapid. Accordingly, the amount of current is limited by dint of the space charge effect across the base region and the collector region. As such, in case it is intended to operate the transistor with a very large current density, it is desirable that the impurity concentration of the high-resistivity region be as high as possible and the thickness thereof is as small as possible, as discussed above. That is, it is desirable to design the structure, so to speak, that the base region 22 is almost in direct contact with the collector region 24. By so designing, however, there would exist the disadvantage that the base-collector junction capacitance becomes large. Nevertheless, because of the fact that, while the increment of junction capacitance becomes greater in inverse proportion with the thickness l' of the high-resistivity region, the increment of current density is by far the steeper, and, as a result, the disadvantage of increase in junction capacitance can be sufficiently compensated for. Also, in the operation of the transistor in the saturation region by the application of a deep forward bias across the base and collector regions, the base-collector capacitance will be dominated more by the diffusion capacitance than by the junction capacitance. It should be appreciated that the diffusion capacitance is smaller in the structure wherein the high impurity concentration region is positioned directly adjacent to the collector region rather than in the structure wherein the high-resistivity region 23 has a considerable thickness. Accordingly, in the case of operation with the application of a forward bias to a certain extent across the base and collector regions, it is advantageous to arrange the high-resistivity region to be as narrow as possible from the viewpoint also of capacitance. Also, in a current region wherein the space charge effect across the base and collector dominates the current versus voltage characteristic, it will be noted that an increase in the collector voltage will result that the current exhibits the I-V characteristic which increments gradually.

Figure 9:
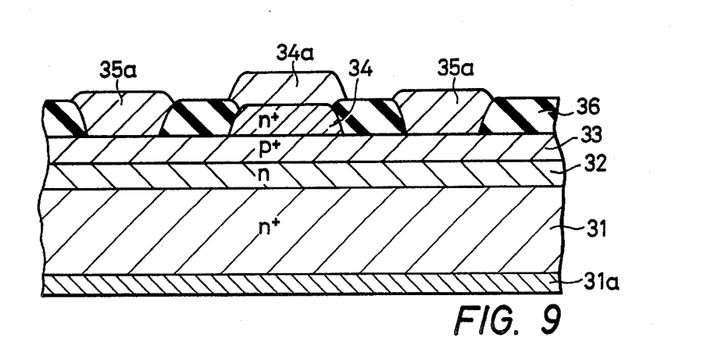
Figure 10:
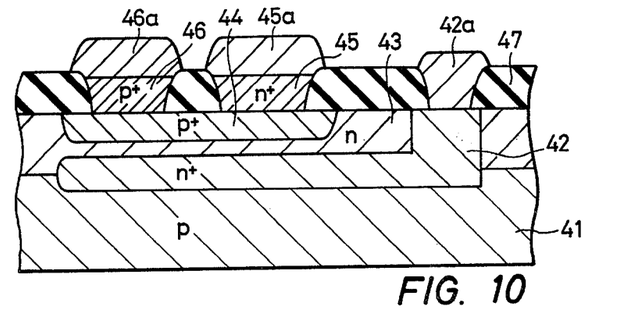
Figure 11:
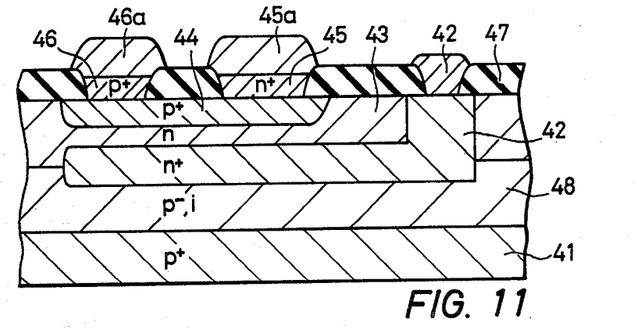

FIGS. 8 to 11 show sectional views of some embodiments of the structure of the transistor (TET) according to the present invention. FIGS. 8 and 9 show the embodiments wherein the transistor (TET) is used as a discrete device. Whereas, FIGS. 10 and 11 show the embodiments wherein the transistor is of a planar structure.

In FIG. 8, reference numeral 31 represents an n$^+$ type collector region, 32 an n type relatively highly resistive region, 33 a p$^+$ type base region, 34 an n$^+$ type emitter region, and 35 a p$^+$ type base-deriving region. Numerals 31a, 34a and 35a represent a collector electrode, an emitter electrode and a base electrode. Numeral 36 represents an insulating layer. The impurity concentrations and the thickness of the p$^+$ type base region 33, the n type high-resistivity region 32 and the n$^+$ type emitter region 34 are determined by taking the above-discussed matters into account. For example, the impurity concentration of that portion of the p$^+$ type base region 33 which is located close to the n$^+$ type emitter region 34 is set at about $3 \times 10^{18}$ cm$^{-3}$ or more, and its thickness is usually set at about 100 Å to several 1000 Å. The base width desirably is as thin as possible to improve the performance. The impurity concentration of the n type high-resistivity region 32 is set in the range of $1 \times 10^{16}$–$1 \times 10^{18}$ cm$^{-3}$, and its thickness is set at 1 μm or less. If an enhanced breakdown voltage is required, this thickness may be increased more. The impurity concentration of the n$^+$ type collector region is set at $1 \times 10^{18}$ cm$^{-3}$ or more. In the designing of the emitter electrode and the base electrode, the interval therebetween is so selected that the frequency characteristic of the device will not be degenerated due to an excessive increase of the base resistance, in association between the impurity concentration and the thickness of the p$^+$ type base region 33. When the p$^+$ type base region is formed with silicon, it is convenient to form the p$^+$ type base-deriving region with polycrystalline silicon. The n+ type emitter region 34 is formed with a semiconductor material having a band gap larger by at least 0.1 eV than that of the p+ type base region 33. For example, if this base region 33 is made of silicon, there can be considered, as an example, to use, as the material of the n+ type emitter region 34, a phosphor-doped SIPOS (Semi-Insulating Polycrystalline Silicon). For example, a SIPOS formed with 55.4% of silicon, 44% of oxygen and 0.6% of phosphor has an energy band gap of about 1.5 eV which is larger by about 0.4 eV than the band gap of silicon. That is, it is possible to increase the impurity concentration of the p+ type base region 33 without lowering the injection efficiency at all. The band gap of SIPOS decreases with an increase in the content of oxygen.

The structure shown in FIG. 9 is exactly the same as that of FIG. 8 excepting that a metal electrode is in direct contact with the p+ type base region 33. If the regions 31, 32 and 33 are made of, for example, GaAs having an energy band gap of 1.45 eV, it is only necessary to form the n+ type emitter region 34 with a mixed compound semiconductor $Ga_{1-x}Al_xAs$. By increase the Al content, the energy band gap, can be made larger progressively. If the ratio x is 0.35, the band bap will become about 1.9 eV, which is larger by about 0.45 eV than the band gap of GaAs. In order to realize the transistor (TET) of the present invention, a ratio x at about 0.1–0.2 will suffice. If a difficulty in operation arises due to an increase in the resistance of contact across the n+ type emitter region 34 and the metal electrode 34a, it is only necessary to form only that portion of this emitter region which contacts the metal electrode by an n+ type GaAs rather than by the material $Ga_{1-x}Al_xAs$. In the case where the device is made of silicon, the insulating layer 36 may be made of such substance as $SiO_2$, $Si_3N_4$, $Al_2O_3$, AlN or their compound film. Alternatively, the insulating layer may be formed with a semi-insulating SIPOS. In the case of GaAs, on the other hand, the insulating may be made with $Si_3N_4$, $Al_2O_3$, $GaO_xN_y$ or their compound film.

In the structures shown in FIGS. 8 and 9, if the p+ type base region is made very thin, almost equal to mean free path of carriers, the impurity concentration distribution of this base region may be uniform. Ordinarily, however, it has a greater thickness. Therefore, the structure thereof is arranged so that a gradient is provided in its impurity concentration so as to accelerate the carriers injected thereinto due to the resulting electric field. Usually, $N_{Abe}/N_{Abc}$ is set at 3 or more. Where $N_{Abe}/N_{Abc}$ increases, the intensity of the electric field will increase accordingly.

Hereunder the dependency of the characteristics of the transistor (TET) according to the present invention upon crystal orientation of the semiconductor material used will be considered.

In the case of GaAs, its minimum point at the bottom of the conduction band exists at the center of Brillouin zone in k-space, i.e., at (000) point, and the relationship between the energy of its conduction band and the wave number is isotropic near the bottom of conduction band. Accordingly, in GaAs, there is no particular significance in the selection of the axial orientation of crystal. In the case of silicon, however, the shape of its conduction band is elliptic in the directions of (100), ($\bar{1}$00), (010), (0$\bar{1}$0), (001) and (00$\bar{1}$). The effective mass in the short axial direction of the elliptic shape is about 0.12 $m_0$, and the effective mass in the long axial direction thereof is about 0.97 $m_0$, wherein $m_0$ represents the free electron mass. Accordingly, even when the energies which are imparted at a given temperature are equal, the thermal velocity of those carriers which flow in the direction of smaller effective mass will be larger. Therefore, the mean free path of electrons in the short axial direction will be relatively elongated. Let us here consider the six directions mentioned above. It can be noted that four valleys of conduction band face the direction of the short axis, whereas two valleys face the direction of the long axis. Electrons exist in equal amounts in these six valleys. Accordingly, $\frac{2}{3}$ of the total electrons will have a high thermal velocity and $\frac{1}{3}$ will have a low thermal velocity. In the transistor (TET) of the present invention, it is important that the distance between the emitter region and the position of the potential barrier be as small as possible so as to be almost equal to or shorter than the mean free path. It is effective to arrange the direction from the emitter toward the collector regions to be aligned with the abovesaid six directions, typically the direction of about (100), in which six directions the mean free path is long.

FIG. 10 shows a sectional view of the structure of a planar TET. On top of a p+ type substrate is provided a buried n+ type region 42 to serve as the collector region. Numeral 43 represents an n type relatively highly resistive region, 44 a p+ type base region, 45 an n+ type emitter region, and 46 a p+ type base lead-out region. Numerals 42a, 45a and 46a represent a collector electrode, an emitter electrode and a base electrode. Numeral 47 represents an insulating layer. The thickness and the impurity concentration of the respective regions are determined in a manner similar to that described in connection with the embodiments of FIGS. 8 and 9. In order to reduce the resistance of the n+ type collector region 42, the impurity concentration of this region is set as high as possible. Usually, it is about $5 \times 10^{18}$ cm$^{-3}$ or more. In order to reduce the capacitance across the collector region and the substrate, the impurity concentration of this p+ type substrate 41 desirably is set as low as possible. It should be noted, however, an excessively low level of impurity concentration of the substrate will constitute a cause of loss, since it will serve as a resistance in a high-speed operation. Accordingly, as shown in FIG. 11, the substrate 41 is made of a p+ type region, and a p− type high-resistivity region or a substantially intrinsic region 48 is provided between the substrate 41 and the n+ type collector region. The thickness and the impurity concentration of this region 48 is selected as follows. Usually, the p+ type substrate 41 is held at a same potential as that of the n+ type emitter region 45 in many cases. Since a positive voltage is applied to the n+ type buried collector region 42, a reverse bias is applied across the substrate and the collector region. Accordingly, the thickness and the impurity concentration of the p− type high-resistivity region 48 are determined so that this region will be substantially or completely depleted at the time of said reverse bias application. As a matter of course, a greater thickness of this region 48 will bring about a smaller collector-substrate capacitance, so that the operation speed will improve. Since the transistor (TET) of the present invention operates at an extremely high speed, it is very effective to arrange a high-resistivity region to intervene between the collector region and the substrate. Needless to say, care has to be taken to avoid structures which, owing to an excessively great thickness of the intervening high-resistivity region, permit a flow of current caused by the "punching-through phenomenon" across region 48 and adjacent collector region 42.

The transistor (TET) allows a very large current to flow through a very fine area, so that it has a large transconductance $g_m$ and a large current gain. Thus, this transistor is very suitable for use in semiconductor integrated circuits. That is, it requires a very small driving power, and it has a large capability to drive subsequent stages and a load. Thus, a large number of fan-outs can be taken, and, moreover, its operating speed is very high. In order to suppress the augmentation of the collector-base diffusion capacitance when this transistor is used in the saturation region, it is only necessary to form the collector region as a region having a wide energy band gap like the emitter region. This is particularly effective in the case when the base region has a non-uniform distribution of impurity concentration.

Needless to say, the transistor (TET) of the present invention can be effectively employed in all types of integrated circuits using bipolar transistors, such as TTL (Transistor-Transistor Logic), ECL (Emitter-Coupled Logic), ISL (Integrated Schottky Logic) and STL (Schottky Transistor Logic).

That is, the thermionic emission transistor (TET) is used as a driving transistor to perform switching of such circuit arrangements as listed above. It should be noted that at least one resistor or transistor is connected, as a load, to the collector region of the thermionic emission transistor.

Figure 12:
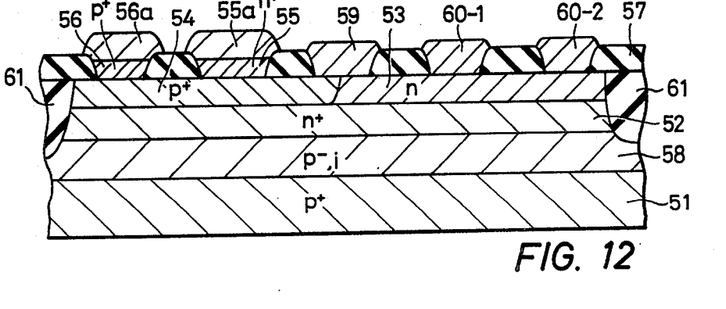
FIG. 12 is a schematic diagram showing a sectional view of an STL using the transistor of the present invention.

FIG. 12 shows a sectional view of an STL structure formed by the use of the transistor (TET) of the present invention. This is an example of one-input and two outputs structure. Numeral 51 represents a p+ type substrate, 52 an n+ type buried collector region which is provided on top of a high-resistivity p− or i type region 58. Numeral 54 represents a p+ base region, 55 an n+ type emitter region, and 56 a p+ type base lead-out region. Numeral 53 represents a high-resistive n type region. Numerals 55a and 56a represent an emitter electrode and a base electrode, respectively. Numeral 59 represents a Schottky diode provided across the base and collector regions. Numerals 60-1 and 60-2 represent Schottky junctions and serve as output terminals. Numerals 57 and 61 represent insulating regions. As a matter of course, the n+ type emitter region 55 is arranged to have an energy band gap broader than that of the p+ type base region 54, whereby a thermionic emission transistor (TET) is formed. This embodiment has the structure that a high-resistivity region 58 is provided between the p+ type substrate and the n+ type collector region. However, there is no need to constitute only such a structure, and a highly resistive p type substrate may be used in place thereof.

Figure 13:
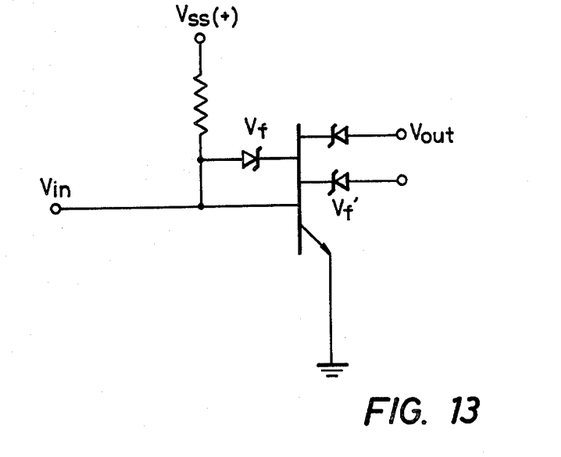
FIG. 13 is a circuit diagram of the STL having the arrangement shown in FIG. 12.

FIG. 13 shows the circuit diagram of the STL having the structure shown in FIG. 12. The logic swing thereof will be represented by the difference ($V_f - V_f$) between the forward voltage drop $V_f$ of the gate clamping Schottky diode and the forward voltage drop of the output Schottky diode $V_f$. In the STL circuit, base-collector is forwardly biased by the amount $V_f$. Therefore, in FIG. 12 the p+ type base region 54 is positioned directly adjacent to the n+ type collector region 52 so as to insure that the base-collector diffusion capacitance will not be augmented. In an operation mode wherein $V_f$ is small, and $V_f$ is small to a certain extent, it will be appreciated that the base-collector diffusion capacitance will not become very large. Therefore, in such an instance, it is also effective to provide a relatively high resistance region between the base and collector regions in order to reduce the junction capacitance.

Description has been made above with respect to some embodiments of the present invention. It should be appreciated that the present invention is that the carriers in the emitter region are caused to pass over the potential barrier due to emission by thermal electrons and to be injected into the base region. It is all the more desirable if arrangement is made, in addition to that mentioned above, so that the base region has a non-uniform impurity concentration distribution to induce an electric field in the base region to allow those carriers injected into the base region to travel at substantially the saturation speed. If, however, a high-resistivity region is to be provided between the base and collector regions, it is required to elevate, beyond a certain degree, the level of the impurity concentration limited thereto. Needless to say, a pnp type transistor (TET) the conductivity types of the respective regions may be inverted from those shown. In short, it is only necessary to form the emitter region with a semiconductor material having an energy band gap layer greater by at least 0.1 eV than the energy band gap of at least the base region, and that the impurity concentration of that portion of the base region located close to the emitter region end, and is set greater than, for example, $3 \times 10^{18}$ cm$^{-3}$, so that the I-V characteristic of the transistor is not dominated by the space charge effect in the high resistivity region. Also, this high-resistivity region is so designed to have a thickness smaller than a certain level to insure that this region is depleted by the application of a slight collector voltage. By setting the distance from the emitter region to the collector region small, the upper limit of the frequency is raised, and also the current is allowed to flow more easily. Thus, the transistor (TET) of the present invention will operate effectively.

It should be appreciated that the transistor (TET) of the present invention can be manufactured by relying on the well-known manufacturing techniques.

What is claimed is:

1. A thermionic emission transistor comprising:
   an emitter region formed with a semiconductor material having a first conductivity type and a high impurity concentration;
   a collector region formed with a semiconductor material having the first conductivity type and a high impurity concentration;
   a base region made of a semiconductor material having a second conductivity type opposite to said first conductivity type and a high impurity concentration, said base region having an impurity concentration distribution such that said base region impurity concentration is maximum in portions adjacent to said emitter region and decreases with distance from said emitter region; and
   a built-in impurity concentration gradient to generate an electric field of a sufficient magnitude to establish carrier travel velocity in substantially all of said base region at a saturation velocity;
   that portion of said emitter region located adjacent to said base region having an energy band gap broader than that of the base region and an impurity concentration higher than that of the base region,
   that portion of said base region located adjacent to the emitter region having an impurity concentration of at least about $3 \times 10^{18}$ cm$^{-3}$;

the impurity concentration of said emitter region and the impurity concentration of that portion of said base region located on the emitter region side being set to insure that the width of the depletion layer growing across the pn junction of the emitter and base regions is substantially the same as the mean free path of carriers.

2. A thermionic emission transistor according to claim 1, wherein the energy band gap of the emitter region is broader by at least 0.1 eV than that of the base region.

3. A thermionic emission transistor according to claim 1 or 2, wherein there is provided, between said base region and said collector region, a semiconductor region having an impurity concentration lower than that of the base and collector regions and having a conductivity type same as that of the collector region.

4. A thermionic emission transistor according to claim 1 or 2, wherein the energy band gap of the collector region is broader than that of the base region.

5. A thermionic emission transistor according to claim 1 or 2, wherein the energy band gap of the collector region is broader by at least 0.1 eV than that of the base region.

6. A thermionic emission transistor according to claim 1 or 2, wherein the impurity concentration of that portion of the base region located adjacent to the emitter region is about $1 \times 10^{19}$ cm$^{-3}$ or more.

7. A thermionic emission transistor according to claim 1 or 2, wherein the impurity concentration of that portion of the base region located adjacent to the emitter region is about $3 \times 10^{19}$ cm$^{-3}$ or more.

8. A thermionic emission transistor according to claim 1 or 2, wherein:
said collector region at least contains a portion buried in a semiconductor substrate having a conductivity type opposite to that of the collector region and a low impurity concentration, and wherein:
said emitter region, said base region and said collector region are provided in a same surface of said semiconductor substrate.

9. A thermionic emission transistor according to claim 2, wherein the ratio between the impurity concentrations in those end portions of said base region contacting a depletion layer is set at three or greater.

10. A thermionic emission transistor according to claim 3, wherein the energy band gap of the collector region is broader than that of the base region.

11. A thermionic emission transistor according to claim 3, wherein the energy band gap of the collector region is broader by at least 0.1 eV than that of the base region.

12. A thermionic emission transistor according to claim 4, wherein the energy band gap of the collector region is broader by at least 0.1 eV than that of the base region.

13. A thermionic emission transistor according to claim 3, wherein the impurity concentration of that portion of the base region located adjacent to the emitter region is about $1 \times 10^{19}$ cm$^{-3}$ or more.

14. A thermionic emission transistor according to claim 4, wherein the impurity concentration of that portion of the base region located adjacent to the emitter region is about $1 \times 10^{19}$ cm$^{-3}$ or more.

15. A thermionic emission transistor according to claim 3, wherein the impurity concentration of that portion of the base region located adjacent to the emitter region is about $3 \times 10^{19}$ cm$^{-3}$ or more.

16. A thermionic emission transistor according to claim 4, wherein the impurity concentration of that portion of the base region located adjacent to the emitter region is about $3 \times 10^{19}$ cm$^{-3}$ or more.

17. A thermionic emission transistor according to claim 3, wherein said collector region at least contains a portion buried in a semiconductor substrate having a conductivity type opposite to that of the collector region, and wherein said emitter region, said base region and said collector region are provided in a same surface of said semiconductor substrate.

18. A thermionic emission transistor according to claim 4, wherein said collector region at least contains a portion buried in a semiconductor substrate having a conductivity type opposite to that of the collector region, and wherein said emitter region, said base region and said collector region are provided in a same surface of said semiconductor substrate.

19. A thermionic emission transistor according to claim 6, wherein said collector region at least contains a portion buried in a semiconductor substrate having a conductivity type opposite to that of the collector region, and wherein said emitter region, said base region and said collector region are provided in a same surface of said semiconductor substrate.

20. In a transistor of the type including emitter, base and collector semiconductor regions, relatively disposed to provide a controllable current path for carriers emitted from said emitter region through said base region to said collector region, the improvement wherein:
said emitter region is formed of a semiconductor material of a first conductivity type, having a first energy band gap, and having a high impurity concentration;
said base region is formed of a semiconductor material having a second energy band gap less than said first energy band gap and of a second conductivity type opposite to said first conductivity type disposed adjacent to said emitter region and forming a hetero-junction therewith, said base region having an impurity concentration distribution such that said base region impurity concentration is maximum in portions adjacent to said hetero-junction and decreases with distance from said hetero-junction; and
a built-in impurity concentration gradient to generate an electric field of a sufficient magnitude to establish carrier travel velocity in substantially all of said base region at a saturation velocity;
said base having a predetermined impurity distribution concentration, the impurity concentration of said base region being at least $3 \times 10^{18}$ cm$^{-3}$ in portions adjacent to said hetero-junction; and
said transistor further includes a built-in depletion layer extending from said hetero-junction having a width no more than the mean free path of carriers in said base region, such that carriers are emitted from said emitter region due to thermal motion travel through said depletion layer without scattering directly into said base region, whereby a high current density is provided.

* * * * *